US012563992B2

(12) United States Patent
Benjamin Raj et al.

(10) Patent No.: US 12,563,992 B2
(45) Date of Patent: Feb. 24, 2026

(54) SYSTEMS AND METHODS TO REDUCE FLOW ACCURACY ERROR FOR LIQUID AND GAS MASS FLOW CONTROLLER DEVICES

(71) Applicant: Applied Materials, Inc., Santa Clara, CA (US)

(72) Inventors: Daemian Raj Benjamin Raj, Fremont, CA (US); Collen Leng, San Jose, CA (US); Syed A. Alam, San Jose, CA (US); Tianyang Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 547 days.

(21) Appl. No.: 17/743,922

(22) Filed: May 13, 2022

(65) Prior Publication Data

US 2023/0369072 A1 Nov. 16, 2023

(51) Int. Cl.
*H01L 21/67* (2006.01)
*H01J 37/32* (2006.01)

(52) U.S. Cl.
CPC .... *H01L 21/67017* (2013.01); *H01J 37/3244* (2013.01); *H01J 37/32899* (2013.01); *H01J 2237/24585* (2013.01); *H01J 2237/332* (2013.01)

(58) Field of Classification Search
None
See application file for complete search history.

(56) References Cited

U.S. PATENT DOCUMENTS

2011/0158826 A1    6/2011   Bauch et al.
2015/0299853 A1*  10/2015   Keller ................... H01M 4/381
                                                            118/726
2016/0178187 A1*   6/2016   Taguchi .................. F22B 1/282
                                                            392/397

FOREIGN PATENT DOCUMENTS

CN    215834503 U      2/2022
JP    09241849 A       9/1997
JP    2000282242 A    10/2000
KR    20030074663 A    9/2003
KR    20160076426 A    6/2016
KR    20160076430 A    6/2016
KR    20200141310 A   12/2020

OTHER PUBLICATIONS

Application No. PCT/US2023/021680 , International Search Report and the Written Opinion, Mailed On Aug. 30, 2023, 9 pages.
(Continued)

*Primary Examiner* — Michael P. Rodriguez
(74) *Attorney, Agent, or Firm* — Kilpatrick Townsend & Stockton LLP

(57) ABSTRACT

Exemplary fluid delivery assemblies for a semiconductor processing system may include a liquid delivery source. The assemblies may include a heater that is fluidly coupled with an outlet of the liquid delivery source. The assemblies may include a liquid flow controller that is fluidly coupled with the liquid delivery source downstream of the heater. The assemblies may include a liquid vaporizer fluidly coupled with a downstream end of the liquid flow controller. The assemblies may include a chamber delivery line coupled with an output of the liquid vaporizer.

10 Claims, 3 Drawing Sheets

(56)        References Cited

OTHER PUBLICATIONS

International Application No. PCT/US2023/021680, International Preliminary Report on Patentability mailed on Nov. 28, 2024, 6 pages.
Taiwanese Application No. 112117743, Office Action mailed on Feb. 20, 2025, 6 pages (1 pages of English Translation and 5 pages of original copy).
Korean Application No. 10-2024-7040745, Office Action mailed on Oct. 14, 2025, 7 pages.

* cited by examiner

300

Flow a liquid from a liquid source — 305

Preheat the liquid prior to the liquid reaching a liquid flow controller — 310

Deliver the liquid to a vaporizer — 315

Vaporize the liquid into a gas — 320

Deliver the gas to one or more chambers — 325

SYSTEMS AND METHODS TO REDUCE FLOW ACCURACY ERROR FOR LIQUID AND GAS MASS FLOW CONTROLLER DEVICES

FIELD OF THE INVENTION

The present technology relates to components and apparatuses for semiconductor manufacturing. More specifically, the present technology relates to gas delivery systems and other semiconductor processing equipment.

BACKGROUND OF THE INVENTION

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process.

Thus, there is a need for improved systems and methods that can be used to produce high quality devices and structures. These and other needs are addressed by the present technology.

BRIEF SUMMARY OF THE INVENTION

Exemplary fluid delivery assemblies for a semiconductor processing system may include a liquid delivery source. The assemblies may include a heater that is fluidly coupled with an outlet of the liquid delivery source. The assemblies may include a liquid flow controller that is fluidly coupled with the liquid delivery source downstream of the heater. The assemblies may include a liquid vaporizer fluidly coupled with a downstream end of the liquid flow controller. The assemblies may include a chamber delivery line coupled with an output of the liquid vaporizer.

In some embodiments, the heater may preheat a liquid supplied by the liquid delivery source to a temperature that is within about 5° C. of a temperature of a body of the liquid flow controller. The assemblies may include one or more processing chambers coupled with an outlet end of the chamber delivery line. The heater may include a block heater. The assemblies may include at least one heater jacket disposed about a fluid supply line extending between the heater and the liquid flow controller. The heater may be disposed within about 10 feet of the liquid flow controller. The heater may preheat a liquid supplied by the liquid delivery source to a temperature that is sufficiently high such that a temperature of the liquid is within about 5° C. of a temperature of a body of the liquid flow controller when the liquid reaches an inlet of the liquid flow controller. The liquid flow controller may include a temperature sensor that measures a temperature of a body of the liquid flow controller. The temperature sensor may be communicatively coupled with the heater.

Some embodiments of the present technology may encompass methods of supplying a fluid to a semiconductor processing chamber. The methods may include flowing a liquid from a liquid source to a liquid flow controller. The methods may include preheating the liquid to a temperature that is within about 5° C. of a temperature of a body of the liquid flow controller prior to the fluid reaching an inlet of the liquid flow controller. The methods may include delivering the liquid to a liquid vaporizer that is downstream of the liquid flow controller. The methods may include vaporizing the liquid into a gas. The methods may include delivering the gas to one or more processing chambers.

In some embodiments, preheating the liquid may include passing the liquid through a block heater. Flowing the liquid from the liquid delivery source to the liquid flow controller may include passing the liquid through a fluid line that is insulated via one or more heater jackets. The methods may include sensing the temperature of the body of the liquid flow controller using a temperature sensor. Preheating the liquid may include controlling a temperature of a heater based on the sensed temperature of the body of the liquid flow controller. Preheating the liquid may include heating the liquid to a temperature that is sufficiently high such that a temperature of the liquid is within about 5° C. of a temperature of a body of the liquid flow controller when the liquid reaches an inlet of the liquid flow controller. The methods may include splitting a flow of the gas into a plurality of fluid lines. The one or more chambers may include a plurality of chambers. Each of the plurality of fluid lines may be fluidly coupled with a respective one of the plurality of chambers. The gas delivered to the one or more processing chambers may be used in processing operations without a temperature equilibrium priming process.

Some embodiments of the present technology may encompass methods of supplying a fluid to a semiconductor processing chamber that may include flowing a liquid from a liquid source to a liquid flow controller. The methods may include preheating a liquid to a temperature that is within about 5° C. of a temperature of a body of a liquid flow controller. The methods may include delivering the preheated liquid to the liquid flow controller. The methods may include vaporizing the liquid into a gas using a liquid vaporizer that is downstream of the liquid flow controller. The methods may include delivering the gas to one or more processing chambers.

In some embodiments, preheating the liquid may include heating the liquid to a temperature that is sufficiently high such that a temperature of the liquid is within about 5° C. of a temperature of a body of the liquid flow controller when the liquid reaches an inlet of the liquid flow controller. Flowing the liquid from the liquid delivery source to the liquid flow controller may include passing the liquid through a fluid line that is insulated via one or more heater jackets. The methods may include sensing the temperature of the body of the liquid flow controller using a temperature sensor. Preheating the liquid may include controlling a temperature of a heater based on the sensed temperature of the body of the liquid flow controller. The methods may include splitting a flow of the gas into a plurality of fluid lines. The one or more chambers may include a plurality of chambers. Each of the plurality of fluid lines may be fluidly coupled with a respective one of the plurality of chambers.

Such technology may provide numerous benefits over conventional systems and techniques. For example, embodiments of the present technology may improve deposition rate uniformity and film uniformity from wafer to wafer. Additionally, in embodiments in which a single fluid system is used to deliver fluids to multiple processing chambers, the deposition rate uniformity and film uniformity may be improved across the different chambers. In particular, deposition rates may be improved by pre-heating liquids prior to being delivered to a liquid flow control device, which may help eliminate temperature differences that lead to flow rate accuracy issues, and subsequent deposition rate issues. Additionally, the components may allow modification to accommodate any number of chambers or processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
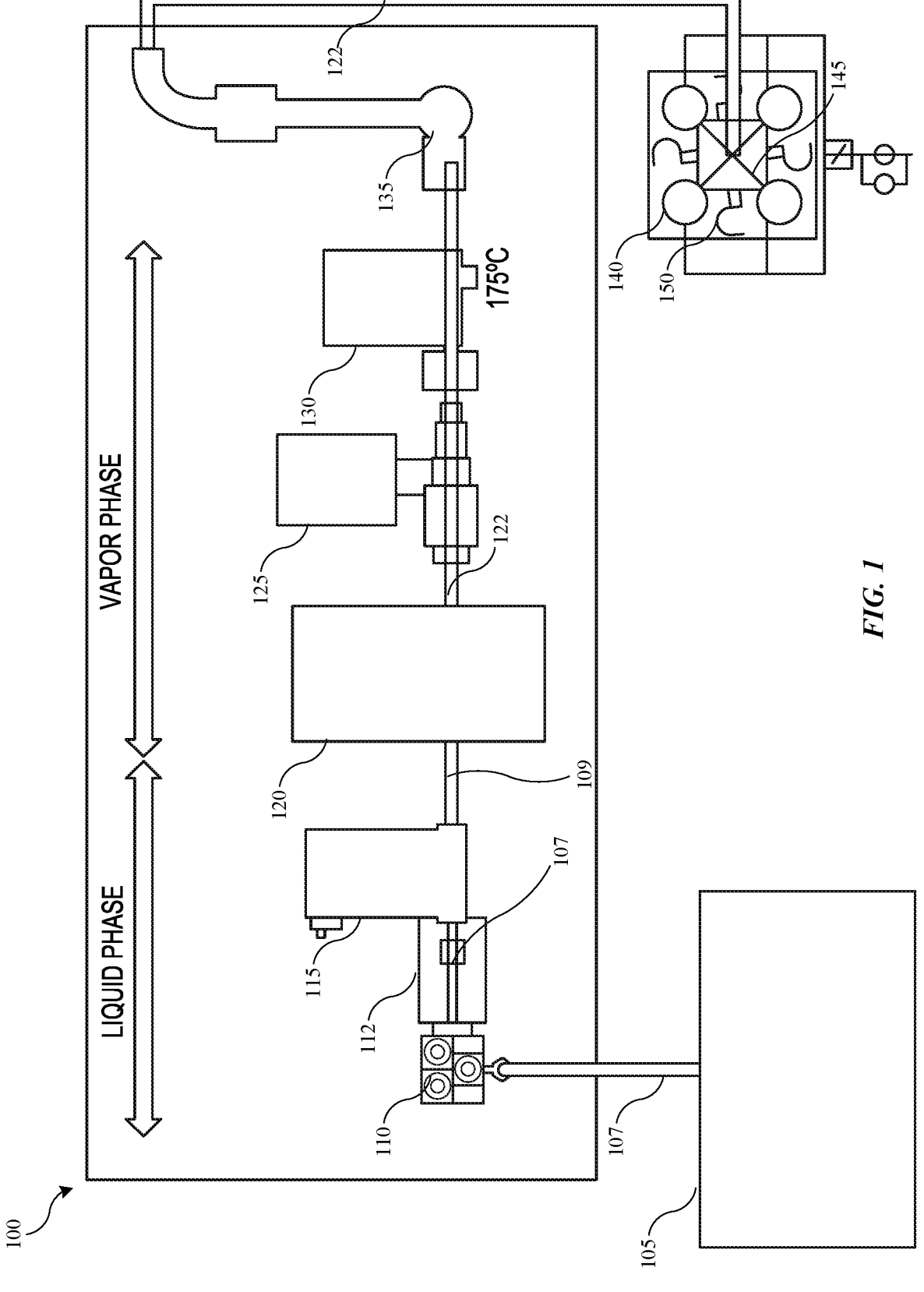
FIG. 1 shows a top plan view of an exemplary processing system according to some embodiments of the present technology.

Several of the figures are included as schematics. It is to be understood that the FIGS. are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition. For example, temperature differences, flow pattern uniformity, and other aspects of processing may impact the films on the substrate, creating film uniformity differences across the substrate for materials produced or removed.

Oftentimes, one or more of the gases flowed into the processing chambers are initially stored in a liquid form. These liquids are flowed to a liquid flow control device, which may selectively deliver the fluids to a vaporizer that may convert the liquids to a gaseous form for delivery to the processing chambers. However, temperature differences between the liquids and the liquid flow control device may lead to line pressure differences that result in flow rate errors, which in turn reduce the deposition rate uniformity from wafer to wafer and/or across multiple processing chambers. Conventional approaches to combating such effects often involve a temperature equilibrium priming process in which a same recipe of gases for a given deposition operation are flowed to the chambers to season the chamber prior to performing any deposition operations. Such priming processes operate by flushing the fluid lines of any stagnate fluids, as well as ensure that a temperature of liquid within the fluid lines equilibrates to prevent the temperature differences between the liquid flow control device and the incoming liquid. However, such processes decrease the efficiency of deposition processes, as the priming processes add additional time (up to or exceeding 15 minutes in some instances) at the beginning of a run and result in the waste of process gases that are used to flush the fluid lines.

The present technology overcomes these challenges by preheating the liquids prior to introducing the liquid to the liquid flow control device. In particular, the liquids may be preheated to a temperature that substantially matches a temperature of the liquid flow control device. This may eliminate or substantially reduce the temperature difference between the liquid flow control device and the incoming liquid and may subsequently improve the flow rate accuracy and resulting deposition rate uniformity, both wafer to wafer and across multiple processing chambers. Embodiments may include a liquid flow control device that includes a temperature sensor that is positioned proximate to a flow path of the device such that accurate temperatures of the liquid flow control device may be utilized to control the temperature of a liquid heating device. Accordingly, the present technology may produce improved film deposition characterized by improved thickness and material property uniformity across a surface of the substrate.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of an exemplary substrate processing system 100 of deposition, etching, baking, and curing chambers according to some embodiments of the present technology. System 100 may include one or more liquid delivery sources 105 that each deliver one or more liquids for conversion to gaseous form prior to being delivered to one or more processing chambers 140. For example, the liquids may be delivered to a gas panel that may include a number of components that condition the liquid for conversion to a gas that is delivered to the various processing chambers 140. For example, the gas panel may include a liquid flow controller 115 that may be fluidly coupled with one or more of the liquid delivery sources 105, such as using one or more liquid supply lines 107. The liquid flow controller 115 may include one or more valves that enable the liquid flow controller 115 to selectively control the flow of liquid from the liquid delivery sources 105 to downstream components of the processing system 100. System 100 may include a heater 110 that is interfaced with the liquid supply lines 107 between the liquid delivery sources 105 and the liquid flow controller 115. For example, the heater 110 may be part of the gas panel and may be fluidly coupled with an outlet end of the fluid delivery source 105 via at least a portion of the liquid supply lines 107 such that the heater 110 is downstream of the fluid delivery source 105 and upstream of the liquid flow controller 115. Such positioning may ensure that all liquid that is delivered to the liquid flow controller 115 must pass through the heater 110. The heater 110 may be any heating mechanism that may heat the liquid supply lines 107 and the liquid passing therethough. The heater 110 may be a gas heater and/or an electrical heater that is disposed about and/or otherwise in contact with the liquid supply line 107 and/or other component of system 100. In a particular embodiment, the heater 110 may be a block heater that is disposed about a portion of a calibration block of the system 100, although various other forms of heaters may be used in other embodiments. In some embodiments, the heater 110 may be positioned proximate to the liquid flow controller 115. For example, the heater 110 may be positioned less than or about 20 feet from the liquid flow controller 115, less than or about 15 feet, less than or about 10 feet, less than or about 5 feet, less than or about 3 feet, less than or about 2 feet, less than or about 1 foot, or less. By positioning the heater 110 proximate to the liquid flow controller 115, heat losses as the preheated liquid is delivered to the liquid flow controller 115 may be reduced and/or minimized. This may help reduce the power consumption and increase the efficiency of the heater 110. The heater 110 may be designed to operate at a pre-set temperature and/or to adjust the temperature based on feedback from one or more sensors to preheat the liquid to a desired temperature as will be discussed in greater detail below.

In some embodiments, all or a portion of the liquid supply lines 107 may be insulated and/or actively heated, such as by using wrap insulation and/or a heater jacket. In some embodiments, the entire length of the liquid supply lines 107 may be covered by insulation and/or a heater jacket. In a particular embodiment, a portion of the liquid supply lines 107 that is disposed between the outlet of the heater 110 and the inlet of the liquid flow controller 115 may include insulation and/or a heater jacket 112. Use of insulation and/or a heater jacket 112 in this region of the liquid supply lines 107 may help reduce heat losses from the preheated liquid and may enable the heater 110 to preheat the liquid to a temperature that is similar to or the same as the temperature of the body of the liquid flow controller 115 (which is oftentimes between or about 20° C. and 50° C., between or about 25° C. and 45° C., or between or about 30° C. and 40° C.). In some embodiments, insulation may be provided between the heater 110 and the liquid flow controller 115, which may prevent the heater 110 from transferring heat to the body of the liquid flow controller 115.

The liquid flow controller 115 may include at least one temperature sensor that may monitor a temperature of a body of the liquid flow controller 115. For example, the sensor may be positioned within the body of the flow controller 115 at a location that is within, adjacent to, and/or otherwise proximate a fluid conduit through which the liquid passes. Such positioning of the sensor may ensure that the temperature recorded by the sensor is indicative of a temperature of a portion of the body of the liquid flow controller 115 that is proximate the liquid. Data from the sensor may be communicated to the heater 110. A controller of the heater 110 may adjust and/or otherwise control a temperature of the heater 110 based on the temperature sensed by the sensor of the liquid flow controller 115. For example, the controller of the heater 110 may set the temperature of the heater 110 to a temperature that heats liquid passing through and/or passing by the heater 110 to a temperature that at least substantially matches a temperature of the body of the liquid flow controller 115. As used herein, substantially matching may be understood to mean within or about 5° C., within or about 4° C., within or about 3° C., within or about 2.5° C., within or about 2° C., within or about 1.5° C., within or about 1° C., within or about 0.5° C., or less, with lower temperature differences resulting in better flow rate accuracy, and ultimately improved deposition rate uniformity wafer to wafer and/or across multiple processing chambers. In some embodiments, the controller of the heater 110 may set the temperature of the heater 110 to a temperature that heats liquid passing through and/or by the heater 110 to a temperature that is sufficient to ensure that the temperature of the liquid at least substantially matches a temperature of the body of the liquid flow controller 115 when the liquid enters the liquid flow controller 115. For example, the temperature of the heater 110 may be set above the measured temperature of the body of the liquid flow controller 115 by at least or about 0.5° C., at least or about 1° C., at least or about 2° C., at least or about 3° C., at least or about 4° C., at least or about 5° C., or more to account for any heat losses from the liquid as the liquid travels from an outlet of the heater 110 to an inlet of the liquid flow controller 115. This may take into account various factors, such as a flow rate of the liquid, a distance between the outlet of the heater 110 and the inlet of the liquid flow controller 115, a diameter of the liquid supply lines 107, the presence and/or heating capacity of heater jackets about a portion of the fluid supply line 107 disposed between the outlet of the heater 110 and the inlet of the liquid flow controller 115, a temperature of the liquid entering the heater 110, and/or other factors. In some embodiments, the measurements from the temperature sensor of the liquid flow controller 115 may be used as an input for a closed loop feedback control that enables the temperature of the heater 110 to be continuously tuned to preheat the liquid to a temperature that at least substantially matches a temperature of the body of the liquid flow controller 115 when the liquid enters the liquid flow controller 115.

Additional sensors may be included in system 100 to enable the temperature of the heater 110 to be controlled to ensure that the liquid is preheated to a temperature that at least substantially matches a temperature of the body of the liquid flow controller 115 when the liquid enters the liquid flow controller 115. For example, one or more flow sensors may be provided in the liquid delivery source 105, liquid delivery lines 107, heater 110, and/or liquid flow controller 115 to measure a flow rate of the liquid. In some embodiments, the liquid delivery source 105 and/or liquid supply lines 107 may include one or more temperature sensors that may monitor a temperature of the liquid that is delivered to the heater 110. The measured temperature may be communicated to the heater 110, such that the controller of the heater 110 may set the temperature of the heater 110 to account for the incoming temperature of the liquid. Various other sensors may be included that may be used to control the temperature of the heater 110 to preheat the liquid to a temperature that at least substantially matches a temperature of the body of the liquid flow controller 115 when the liquid enters the liquid flow controller 115.

By preheating the liquid to a temperature that is substantially the same as a temperature of the body of the liquid flow controller, a temperature difference between the body of the liquid flow controller and the liquid at the inlet of the liquid controller may be reduced, minimized, and/or eliminated.

This may improve the flow rate accuracy of the liquid and may ultimately improve the deposition rate uniformity wafer to wafer. In embodiments including multiple chambers, the preheating may improve the deposition rate uniformity across the different chambers. Additionally, such preheating may enable any temperature equilibrium priming processes to be shortened and/or completely eliminated, which may increase the efficiency of processing operations and may reduce the amount of waste.

System 100 may include a liquid vaporizer 120 that is fluidly coupled with a downstream end of the liquid flow controller 115, such as using one or more additional liquid supply lines 109. Using one or more valves, the liquid flow controller 115 may selectively control a flow rate and/or flow volume of liquid, if any, that is delivered to the liquid vaporizer 120. Liquid that is supplied to the liquid vaporizer 120 may be vaporized into a gas that is transportable to one or more processing chambers 140. For example, in some embodiments the liquid vaporizer 120 may heat the liquid to a temperature that is sufficiently high so as to vaporize the liquid. The liquid vaporizer 120 may be any kind of vaporizing unit, such as a bubbler, a flash vaporizer, a direct liquid injection vaporizer, and/or other types of vaporizer (which may or may not use carrier gases).

The gas generated by the vaporizer 120 may be delivered to other gas panel components. For example, the gas may be passed to a line pressure baratron 125, a number of valves 130, a mass flow controller, and/or other gas delivery architecture components, some or all of which may be part of a gas panel in some embodiments. As illustrated, the gas generated by the vaporizer 120 may be passed through line pressure baratron 125, which may monitor a pressure of the gas within one or more chamber delivery lines 122 that are coupled with an outlet of the vaporizer 120 and that deliver the gas to one or more processing chambers 140. Valves 130 and/or a mass flow controller may be used to selectively control the flow rate and/or pressure within the chamber delivery lines 122. In some embodiments, the valves 130 may be adjusted based on a pressure measurement from the line pressure baratron 125 to maintain the gas within the chamber delivery lines 122 at a desired pressure level. The gas panel may include at least one pressure switch 135 that may control the flow of gas to one or more processing chambers 140 based on pressure within the chamber delivery lines 122 and/or that operate to maintain a desired pressure within the chamber delivery lines 122. Upon passing through the pressure switch 135, the gas may be delivered to the processing chambers 140. In some embodiments, the gas may be delivered to a single chamber 140, while in other embodiments the gas may delivered to multiple chambers 140 simultaneously. For example, the gas may be passed through one or more splitters (not shown) that may divide the gas into one or more fluid lines 145 that each deliver the gas to a separate chamber 140.

In some embodiments, prior to being delivered to the processing chambers 140, the gas may be mixed with one or more other gases. The mixing of the gases may occur within the gas panel, such as using one or more gas blocks and/or may be mixed at one or more components interfaced between the gas panel and the processing chambers 140. The gases may include cleaning gases, purge gases, plasma-generating precursors, and/or other types of process gases using in semiconductor fabrication operations.

As illustrated, the system 100 includes four processing chambers 140, although any number of processing chambers 140 may be present in various embodiments. For example, processing system 100 may include standalone chambers, twin chambers, and other multiple chamber systems. Each chamber 140 may define a processing region in which one or more processing operations, such as deposition processes including cyclical layer deposition, atomic layer deposition, chemical vapor deposition, physical vapor deposition, as well as etch, pre-clean, anneal, plasma processing, degas, orientation, and other substrate processes may be performed. A number of robotic arms 150 may be used to transfer substrates into and out of the processing chambers 140.

Figure 2:
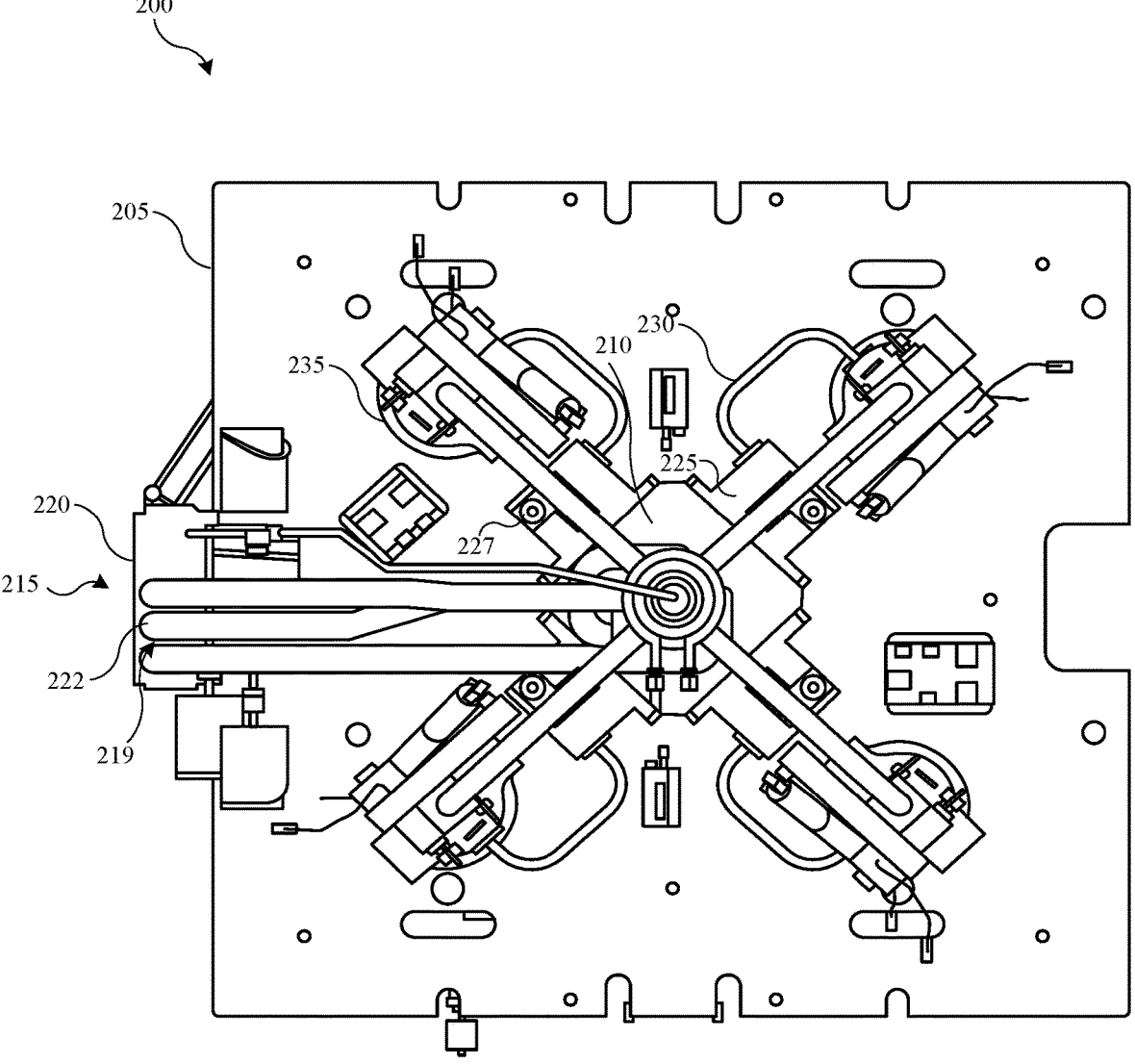
FIG. 2 shows a schematic top plan view of an exemplary processing system according to some embodiments of the present technology.

As noted above, the gas panel may include one or more chamber delivery lines 122 and fluid lines 145 that deliver a mixture of one or more gases to one or more processing chambers and/or manifolds. For example, the gas panel may be remotely located from the processing chambers 140 (such as below the processing chamber). The chamber delivery lines 122 may be coupled with fluid lines 145, such as weldments, that direct the gases from the gas panel to the processing chambers 140 and/or manifolds of a processing system. FIG. 2 shows a schematic top plan view of one embodiment of a semiconductor processing system 200 according to some embodiments of the present technology. The figure may include components of any of the systems illustrated and described previously, and may also show further aspects of any of the previously described systems. It is to be understood that the illustration may also show exemplary components as would be seen on any number of chambers 140 described above.

Semiconductor processing system 200 may include a lid plate 205, which may define a number of apertures that each which provide access to a number of processing chambers (which may be similar to processing chambers 140) positioned beneath the lid plate 205. Each aperture of the plurality of apertures may be defined to provide fluid access to a specific lid stack, processing chamber, and/or processing region.

A gas splitter assembly 210 may be seated on a top surface of the lid plate 205. For example, the gas splitter assembly 210 may be centered between the apertures of the lid plate 205. The gas splitter assembly 210 may be fluidly coupled with a number of input weldments 215 that are each coupled with and/or part of a respective chamber delivery line 222 (which may be similar to chamber delivery lines 122) of a gas panel, such as the gas panel of system 100. Input weldments 215 may deliver gases, such as precursors, plasma effluents, and/or purge gases from a number of gas sources to the gas splitter assembly 210. For example, each of the input weldments 215 may extend vertically from a gas panel positioned below the lid plate 205 and pass through a feedthrough plate 220. A portion of the input weldments 215 above the feedthrough plate 220 may be bent horizontally and may direct the gases toward the gas splitter assembly 210. In some embodiments, some or all of the input weldments 215 may be disposed within heater jackets 219 that help prevent heat loss along the length of the input weldments 215.

The gas splitter assembly 210 may receive gases from the input weldments 215 and may recursively split the gas flows into a greater number of gas outputs that are each interfaced with one or more valves 227 that help control flow of gases through the valve block 225. For example, actuation of the valves 227 may control whether purge and/or process gases are flowed to a respective processing chamber or are diverted away from the processing chamber to another location of the system 200. For example, outlets of gas splitter assembly 210 may each be fluidly coupled with an output weldment 230, which may be similar to fluid lines 145. Output weldments 230 may deliver the purge gas and/or process gas to an output manifold 235 associated with a particular processing chamber. For example, an output manifold 235 may be positioned over each aperture formed within the lid plate 205 and may be fluidly coupled with the lid stack components to deliver one or more gases to a processing region of a respective processing chamber.

Figure 3:
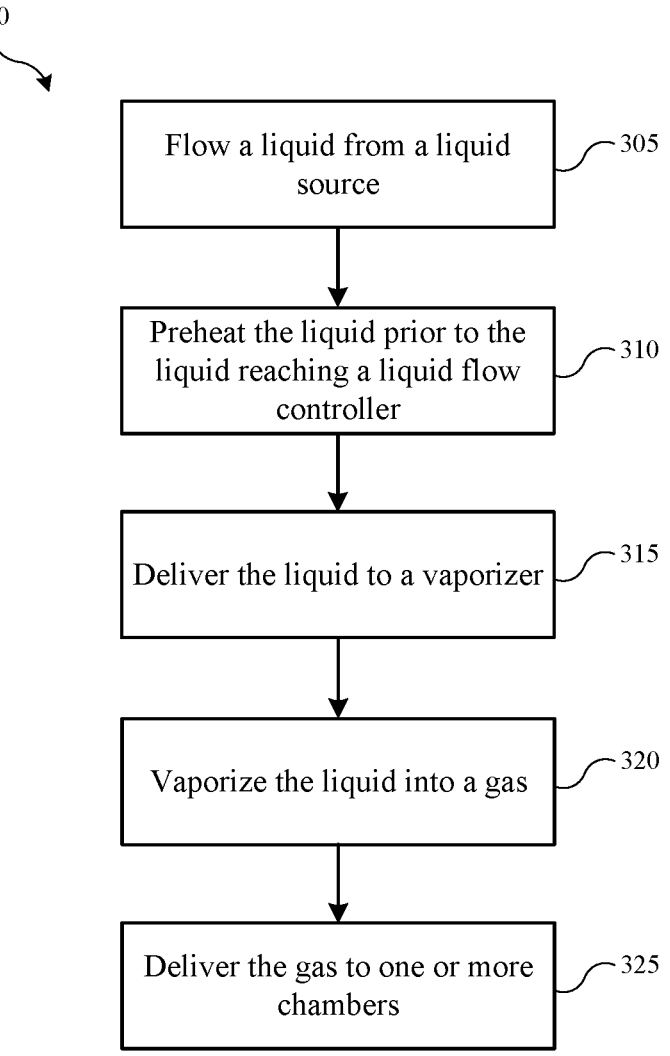
FIG. 3 shows operations of an exemplary method of flowing a gas to one or more processing chambers according to some embodiments of the present technology.

FIG. 3 shows operations of an exemplary method 300 of supplying a fluid to a processing chamber according to some embodiments of the present technology. The method may be performed in a variety of processing systems, including processing system 100 or 200 described above, which may include gas panels according to embodiments of the present technology, such as any gas panel discussed previously. Method 300 may include a number of optional operations, which may or may not be specifically associated with some embodiments of methods according to the present technology.

Method 300 may include a processing method that may include operations for forming a hardmask film or other deposition operations. The method may include optional operations prior to initiation of method 300, or the method may include additional operations. For example, method 300 may include operations performed in different orders than illustrated. Method 300 may include flowing a liquid from a liquid source at operation 305. As the liquid is flowed to the liquid flow controller, the liquid may be preheated to a temperature that is within about 5° C. of a temperature of a body of the liquid flow controller prior to the fluid reaching an inlet of the liquid flow controller at operation 310. For example, the liquid may be passed through a heater (such as, but not limited to, a block heater) that is disposed between the liquid delivery source and the liquid flow controller. In some embodiments, the liquid may be preheated to a temperature that is sufficiently high such that a temperature of the liquid is within about 5° C. of a temperature of a body of the liquid flow controller when the liquid reaches an inlet of the liquid flow controller. For example, the temperature of the heater may be adjusted to preheat the liquid to a temperature that is greater than the temperature of the body of the liquid flow controller to account for any heat losses that may occur as the liquid is transported from an outlet of the heater to an inlet of the liquid flow controller. In some embodiments, the temperature of the heater may be set above the measured temperature of the body of the liquid flow controller 115 by at least or about 0.5° C., at least or about 1° C., at least or about 2° C., at least or about 3° C., at least or about 4° C., at least or about 5° C., or more to account for any heat losses from the liquid as the liquid travels from an outlet of the heater to an inlet of the liquid flow controller. The temperature of the heater may be controlled to take into account various factors, such as a flow rate of the liquid, a distance between the outlet of the heater and the inlet of the liquid flow controller, a diameter of the liquid supply lines that transport the liquid through the heater, the presence and/or heating capacity of heater jackets about a portion of the fluid supply line disposed between the outlet of the heater and the inlet of the liquid flow controller, a temperature of the liquid entering the heater, and/or other factors. In some embodiments, flowing the liquid from the liquid source to the liquid flow controller may include passing the liquid through a fluid line that is insulated via one or more heater jackets. Such an arrangement may help mitigate heat losses from the liquid as the liquid travels from an outlet of the heater to an inlet of the liquid flow controller.

Method 300 may optionally include sensing the temperature of the body of the liquid flow controller using a temperature sensor. Based on the sensed temperature of the body of the liquid flow controller, a temperature of the heater may be set and/or adjusted to ensure that the liquid is preheated to the correct temperature. In some embodiments, a temperature of the liquid may be monitored prior to the liquid entering the heater, which may further enable the temperature of the heater to be tuned to preheat the liquid to the correct temperature. In some embodiments, a measurement and/or other indication of the flow rate of the liquid through the heater may be provided to a controller of the heater to further tailor the temperature of the heater.

By preheating the liquid to a temperature that is substantially the same as a temperature of the body of the liquid flow controller, a temperature difference between the body of the liquid flow controller and the liquid at the inlet of the liquid controller may be reduced, minimized, and/or eliminated. This may improve the flow error of the liquid and may ultimately improve the deposition rate uniformity wafer to wafer. In embodiments including multiple chambers, the preheating may improve the deposition rate uniformity across the different chambers. Additionally, such preheating may enable any temperature equilibrium priming processes to be shortened and/or completely eliminated, which may increase the efficiency of processing operations and may reduce the amount of waste.

The method 300 may include delivering the liquid to a liquid vaporizer that is downstream of the liquid flow controller at operation 315. For example, the liquid flow controller may selectively throttle and/or otherwise control the flow of liquid to the liquid vaporizer. At operation 320, the vaporizer may vaporize the liquid into a gas. For example, the vaporizer may be a bubbler, a flash vaporizer, a direct liquid injection vaporizer, and/or other type of vaporizer that is capable of converting the liquid into a gaseous form. Upon being converted, the gas may be delivered to one or more processing chambers at operation 325. In some embodiments, the flow of gas to the chambers may be controlled by one or more valves, mass flow controllers, pressure switches, and/or other components of the gas panel and/or other section of the processing system. In some embodiments, the gas may be mixed with one or more other gases prior to being flowed to the processing chambers. For example, the gas may be mixed with other gases in the gas panel to produce a gas mixture for a given processing and/or cleaning recipe. In some embodiments in which multiple processing chambers are used, the flow of gas may be split into a number a fluid lines prior to being delivered to the chambers. For example, the gases may be flowed through one or more gas splitters that divide the flow into separate flow paths, with each flow path/fluid line being fluidly coupled with a respective one of the plurality of chambers. In such a manner, an equal flow of gas may be delivered to each of the multiple chambers using a single flow from a gas panel.

As noted above, in some embodiments, the gas delivered to the one or more processing chambers may be used in processing operations without a temperature equilibrium priming process, or with a shortened priming process. The gases delivered to the processing chambers may be used for performing film deposition operations, etching operations, and/or other substrate processing operations. For example, in some embodiments, the gases may include one or more precursors and the film deposition operation may include flowing one or more precursors into a processing chamber. For example, the precursor may be flowed into a chamber, such as included in system 100 or 200, and may flow the precursor through one or more of a gasbox, a blocker plate, or a faceplate, prior to delivering the precursor into a processing region of the chamber. In some embodiments the precursor may be or include a carbon-containing precursor. A plasma may be generated of the precursors within the processing region, such as by providing RF power to the faceplate to generate a plasma. Material formed in the plasma, such as a carbon-containing material, may be deposited on the substrate to form one or more film layers atop the substrate.

In some embodiments, the gases delivered to the processing chambers may be used for performing cleaning and/or purge operations before and/or after the performance of substrate processing operations. It will be appreciated that any number of different gases may be sequentially flowed in a manner similar to described above to perform any number of processing, cleaning, and/or purge operations within one or more processing chambers.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a region" includes a plurality of such regions, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of supplying a fluid to a semiconductor processing chamber, comprising:
  flowing a liquid from a liquid source to a liquid flow controller;

preheating the liquid to a temperature that is within about 5° C. of a temperature of a body of the liquid flow controller prior to the fluid reaching an inlet of the liquid flow controller;
  delivering the liquid to a liquid vaporizer that is downstream of the liquid flow controller;
  vaporizing the liquid into a gas;
  splitting a flow of the gas into a plurality of fluid lines, each of the plurality of fluid lines is fluidly coupled with a respective one of a plurality of processing chambers; and
  delivering the gas to the plurality of processing chambers.

2. The method of supplying a fluid to a semiconductor processing chamber of claim 1, wherein:
  preheating the liquid comprises passing the liquid through a block heater.

3. The method of supplying a fluid to a semiconductor processing chamber of claim 1, wherein:
  flowing the liquid from the liquid source to the liquid flow controller comprises passing the liquid through a fluid line that is insulated via one or more heater jackets.

4. The method of supplying a fluid to a semiconductor processing chamber of claim 1, further comprising:
  sensing the temperature of the body of the liquid flow controller using a temperature sensor, wherein preheating the liquid comprises controlling a temperature of a heater based on the sensed temperature of the body of the liquid flow controller.

5. The method of supplying a fluid to a semiconductor processing chamber of claim 1, wherein:
  preheating the liquid comprises heating the liquid to a temperature that is sufficiently high such that a temperature of the liquid is within about 5° C. of a temperature of a body of the liquid flow controller when the liquid reaches an inlet of the liquid flow controller.

6. The method of supplying a fluid to a semiconductor processing chamber of claim 1, wherein:
  the gas delivered to the one or more processing chambers is used in processing operations without a temperature equilibrium priming process.

7. A method of supplying a fluid to a semiconductor processing chamber, comprising:
  flowing a liquid from a liquid source;
  preheating a liquid to a temperature that is within about 5° C. of a temperature of a body of a liquid flow controller;
  delivering the preheated liquid to the liquid flow controller;
  vaporizing the liquid into a gas using a liquid vaporizer that is downstream of the liquid flow controller;
  splitting a flow of the gas into a plurality of fluid lines, each of the plurality of fluid lines is fluidly coupled with a respective one of a plurality of processing chambers; and
  delivering the gas to the plurality of processing chambers.

8. The method of supplying a fluid to a semiconductor processing chamber of claim 7, wherein:
  preheating the liquid comprises heating the liquid to a temperature that is sufficiently high such that a temperature of the liquid is within about 5° C. of a temperature of a body of the liquid flow controller when the liquid reaches an inlet of the liquid flow controller.

9. The method of supplying a fluid to a semiconductor processing chamber of claim 7, wherein:

flowing the liquid from the liquid delivery source to the liquid flow controller comprises passing the liquid through a fluid line that is insulated via one or more heater jackets.

10. The method of supplying a fluid to a semiconductor processing chamber of claim 7, further comprising:

sensing the temperature of the body of the liquid flow controller using a temperature sensor, wherein preheating the liquid comprises controlling a temperature of a heater based on the sensed temperature of the body of the liquid flow controller.

\* \* \* \* \*